US007867884B2

(12) United States Patent
Kamimura et al.

(10) Patent No.: US 7,867,884 B2
(45) Date of Patent: Jan. 11, 2011

(54) SAMPLE WAFER FABRICATION METHOD

(75) Inventors: Tomohiro Kamimura, Kanagawa (JP); Kou Sasaki, Kanagawa (JP); Tomoharu Inoue, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 176 days.

(21) Appl. No.: 12/103,264

(22) Filed: Apr. 15, 2008

(65) Prior Publication Data
US 2008/0261386 A1    Oct. 23, 2008

(30) Foreign Application Priority Data
Apr. 18, 2007  (JP)  ............................. 2007-109302

(51) Int. Cl.
*H01L 21/425*    (2006.01)
(52) U.S. Cl. .................. 438/529; 438/232; 438/275; 438/527; 438/942; 438/948; 257/500; 257/E21.317; 257/E21.633
(58) Field of Classification Search .................. 438/527, 438/232, 275, 529, 942, 948; 257/E21.317, 257/E21.633, 500
See application file for complete search history.

(56) References Cited

U.S. PATENT DOCUMENTS 5,795,803 A * 8/1998 Takamura et al. ............ 438/228

OTHER PUBLICATIONS

Carver Mead (author), Shiro Usui and Hiroo Yonezu (translators) "Analog VLSI and Neural System", Toppan Printing Co., Ltd. Appendix CMOS fabrication method.

* cited by examiner

*Primary Examiner*—Matthew C Landau
*Assistant Examiner*—Vicki B Booker
(74) *Attorney, Agent, or Firm*—Young & Thompson

(57) ABSTRACT

A wafer fabrication method includes a first step of forming a plurality of first channel regions in a first region on a surface of a wafer, a second step of forming a plurality of second channel regions having an impurity concentration different from an impurity concentration of the first channel regions, a third step of forming a plurality of third channel regions in a third region on the surface of the water, and a fourth step of forming a plurality of fourth channel regions having an impurity concentration different from an impurity concentration of the third channel regions in a fourth region, wherein the first region and the second region are divided by a first line segment on the wafer, and the third and fourth regions are divided by a second line segment intersecting with the first line segment on the wafer.

2 Claims, 6 Drawing Sheets

SAMPLE WAFER FABRICATION METHOD

BACKGROUND OF THE INVENTION

1. Field of the Invention

The present invention relates to a method of fabricating a sample wafer and, particularly, to a method of fabricating a sample wafer for forming sample transistors having different characteristics.

2. Description of Related Art

Heretofore, when determining the impurity concentration of an N-channel transistor and a P-channel transistor to be formed on a wafer, each transistor level is made differently by controlling an impurity channel doping amount (well impurity ion doping amount) for threshold control on each wafer.

FIG. 7 is a flowchart showing a method of fabricating a sample wafer according to a related art. According to the method, the process first coats a resist on a wafer (S101) and performs exposure and development in a predetermined region (S102). Then, the process implants a P-type ion, for example, into a formed resist pattern (S103) and removes the resist (S104). After that, the process coats another resist (S105), performs exposure and development (S106), then implants an N-type ion (S107), and finally removes the resist (S108).

In the above method, the transistors with different levels are formed on different wafers. Specifically, a wafer having the characteristics (Tr1) that the ON-current of an N-channel transistor is small and the ON-current of a P-channel transistor is large, a wafer having the characteristics (Tr2) that the ON-current of an N-channel transistor is large and the ON-current of a P-channel transistor is large, a wafer having the characteristics (Tr3) that the ON-current of an N-channel transistor is large and the ON-current of a P-channel transistor is small, and a wafer having the characteristics (Tr4) that the ON-current of an N-channel transistor is small and the ON-current of a P-channel transistor is small are formed as shown in FIG. 1, and if a desired level of leakage current, switching characteristics or the like is obtained, a channel doping amount which has the intermediate value (Tr5) of them is estimated (cf. Carver Mead (author), Shiro Usui and Hiroo Yonezu (translators), "Analog VLSI and Neural Systems", TOPPAN PRINTING Co., Ltd. Appendix CMOS fabrication method).

In this method, it is necessary to form a wafer which includes a transistor in which a P-type impurity ion is doped at a high concentration and a transistor in which an N-type impurity ion is doped at a low concentration, a wafer which includes a transistor in which a P-type impurity ion is doped at a high concentration and a transistor in which an N-type impurity ion is doped at a high concentration, a wafer which includes a transistor in which a P-type impurity ion is doped at a low concentration and a transistor in which an N-type impurity ion is doped at a low concentration, and a wafer which includes a transistor in which a P-type impurity ion is doped at a low concentration and a transistor in which an N-type impurity ion is doped at a high concentration.

Because the above-described method of forming a level pattern prepares a wafer for each level, it is difficult to suppress variations between substrates. Further, because it requires the same number of wafers as levels, which is four in the above-described example, the number of diffusion steps is large to cause higher costs and the length of tester usage time is long for evaluating different sample wafers, thus taking a long time for testing.

SUMMARY

According to an embodiment of the present invention, there is provided a sample wafer fabrication method. The method includes forming a first channel region with a first conductivity type and a second channel region with a second conductivity type using a first resist pattern and a second resist pattern formed at a first exposure shot as a mask, and forming a third channel region with the first conductivity type and a fourth channel region with the second conductivity type using a third resist pattern and a fourth resist pattern formed at a second exposure shot different from the first exposure shot as a mask. Either one of the first channel region and the third channel region and/or either one of the second channel region and the fourth channel region is different from the other in impurity concentration.

Because the channel regions having different impurity concentrations are formed on one wafer, it is possible to form transistors with different levels on one wafer. This eliminates variations between substrates and reduces costs.

The present invention provides a fabrication method of a sample wafer having different transistor characteristics on one wafer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

An exemplary embodiment of the present invention is described hereinafter in detail with reference to the drawings.

Figure 1:
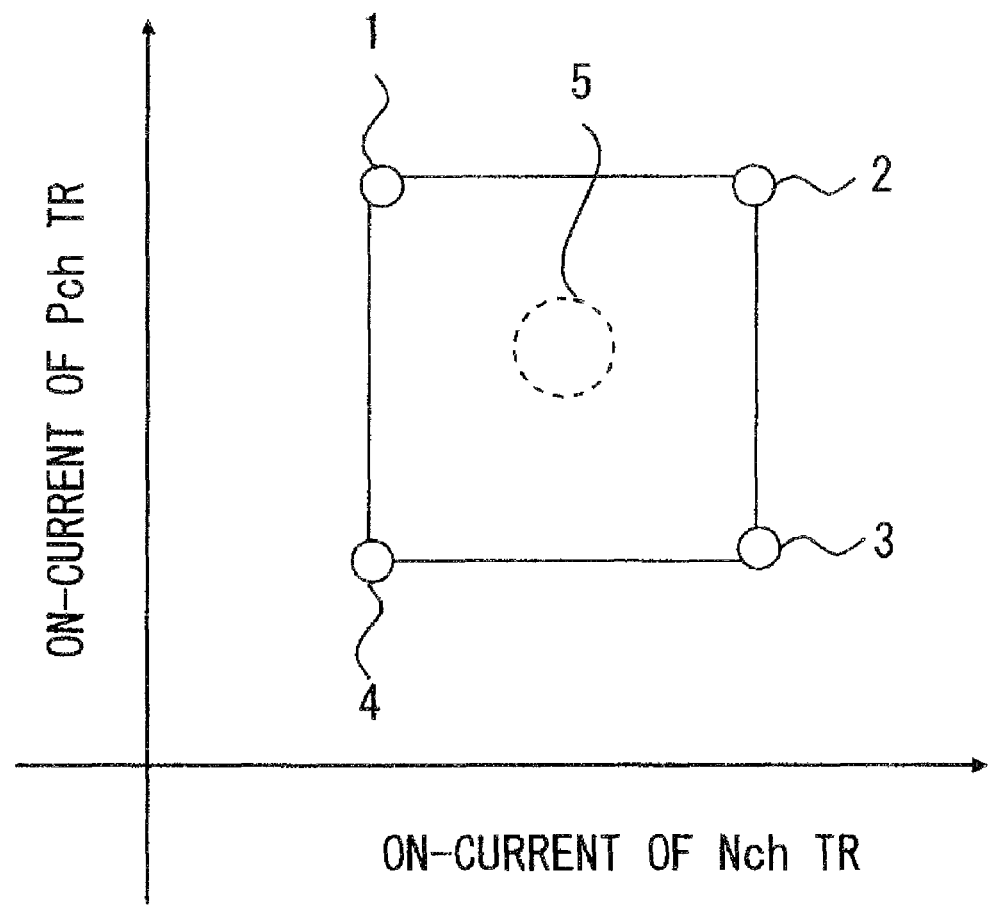
FIG. 1 is a view showing transistor characteristics with a horizontal axis indicating the ON-current of an N-channel transistor and a vertical axis indicating the ON-current of a P-channel transistor.

FIG. 1 is a view showing transistor characteristics with a horizontal axis indicating the ON-current of an N-channel transistor and a vertical axis indicating the ON-current of a P-channel transistor. The point Tr1 at the upper left of the graph indicates the transistor characteristics that the ON-current of an N-channel transistor is small and the ON-current of a P-channel transistor is large. In order to obtain such characteristics, it is necessary to prepare a wafer which includes a transistor having a channel region in which a doping amount of an N-type impurity (channel dose amount) in a well is low, that is, an N-type impurity ion doping amount is low, and a transistor having a channel region in which a doping amount of a P-type impurity in a well is high, that is, a P-type impurity ion doping amount is high. The point Tr2 at the upper right of the graph indicates the transistor characteristics that the ON-current of an N-channel transistor is large and the ON-current of a P-channel transistor is also large. In order to obtain such characteristics, it is necessary to prepare a wafer which includes a transistor having a channel region in which an N-type impurity ion doping amount is high and a transistor having a channel region in which a P-type impurity ion doping amount is also high.

The point Tr3 at the lower right of the graph indicates the transistor characteristics that the ON-current of an N-channel transistor is large and the ON-current of a P-channel transistor is small. In order to obtain such characteristics, it is necessary to prepare a wafer which includes a transistor having a channel region in which an N-type impurity ion doping amount is high and a transistor having a channel region in which a P-type impurity ion doping amount is low. The point Tr4 at the lower left of the graph indicates the transistor characteristics that the ON-current of an N-channel transistor is small and the ON-current of a P-channel transistor is also small. In order to obtain such characteristics, it is necessary to prepare a wafer which includes a transistor having a channel region in which an N-type impurity ion doping amount is low and a transistor having a channel region in which a P-type impurity ion doping amount is also low.

After the transistors with the above four levels (characteristics) are formed, if desired characteristics are obtained as a result of inspecting a switching speed, leakage current and so on, an impurity doping amount is determined so as to form a transistor having the channel region which exhibits the characteristics indicated by Tr5 in the graph of FIG. 1. Although the sample wafers on which the transistors having the channel regions which respectively satisfy the characteristics Tr1 to Tr4, which are four sample wafers in this example, are fabricated in a related art, the transistors having the channel regions which respectively satisfy the characteristics Tr1 to Tr4 are formed on one wafer in this embodiment. This eliminates variations between wafers and enables the formation of a sample wafer which only requires the consideration of wafer in-plane tendency. The method of forming such channel regions is described hereinbelow.

FIGS. 2A to 2E are views showing a sample wafer fabrication method according to a first embodiment of the present invention. FIG. 3 is a flowchart showing the sample wafer fabrication process.

The process first coats a resist all over a wafer 10 (S1). Then, the process performs exposure at an exposure shot indicated by a region 20 with the use of a P-type mask and further performs development, thereby forming a resist pattern (S2). In this embodiment, the resist pattern in this step is formed in the lower half of the wafer 10 which is divided into two parts by a line segment L1. Using the resist pattern which is formed in the lower half of the wafer 10 as a mask, a high concentration P-type impurity ion is applied. For example, boron may be used as the impurity, and the impurity concentration may be about $1.5\times10^{13}$ (cm$^{-2}$). A high concentration P-type channel region 31 is thereby formed (FIG. 2A; S3). As a result of the implantation of the high concentration P-type ion, a low threshold PMOS transistor is formed in the lower half of the wafer 10 as described in detail later. Finally, the process removes the resist from the entire wafer (S4).

After that, the process coats a resist all over the wafer 10 (S5). Then, the process performs exposure at the exposure shot indicated by the region 20 with the use of the P-type mask which is the same as the one used in the formation of the high concentration P-type channel region 31 and further performs development, thereby forming a resist pattern (S6). In this embodiment, the resist pattern in this step is formed in the upper half of the wafer 10 which is divided into two parts by the line segment L1. Using the resist pattern which is formed in the upper half of the wafer 10 as a mask, a low concentration P-type impurity ion is applied. For example, boron may be used as the impurity, and the impurity concentration may be about $8\times10^{12}$ (cm$^{-2}$). A low concentration P-type channel region 32 is thereby formed (FIG. 2B; S7). As a result of the implantation of the low concentration P-type ion, a high threshold PMOS transistor is formed in the upper half of the wafer 10 as described in detail later. Finally, the process removes the resist (S8). The high concentration P-type channel region 31 and the low concentration P-type channel region 32 are thereby formed in the lower half and the upper half of the wafer 10, respectively.

Further, the process coats a resist all over the wafer 10 (S9). Then, the process performs exposure at the exposure shot indicated by the region 20 with the use of an N-type mask and further performs development, thereby forming a resist pattern (S10). In this embodiment, the resist pattern in this step is formed in the left half of the wafer 10 which is divided into two parts by a line segment L2. Although the line segment L1 and the line segment L2 intersect at right angles in this embodiment, it is not limited thereto as long as the line segment L1 and the line segment L2 intersect with each other. Using the resist pattern which is formed in the left half of the wafer 10 as a mask, a high concentration N-type impurity ion is applied. For example, phosphorus may be used as the impurity, and the impurity concentration may be about $2.2\times10^{13}$ (cm$^{-2}$) A high concentration N-type channel region 33 is thereby formed (FIG. 2C; S11). As a result of the implantation of the high concentration N-type ion, a low threshold NMOS transistor is formed in the left half of the wafer 10 as described in detail later. Finally, the process removes the resist (S12).

After that, the process coats a resist all over the wafer 10 (S13) Then, the process performs exposure at the exposure shot indicated by the region 20 with the use of the N-type mask which is the same as the one used in the formation of the high concentration N-type channel region 33 and further performs development, thereby forming a resist pattern (S14). In this embodiment, the resist pattern in this step is formed in the right half of the wafer 10 which is divided into two parts by the line segment L2. Using the resist pattern which is formed in the right half of the wafer 10 as a mask, a low concentration N-type impurity ion is applied. For example, phosphorus may be used as the impurity, and the impurity concentration may be about $1.5\times10^{13}$ (cm$^{-2}$) A low concentration N-type channel region 34 is thereby formed (FIG. 2D; S15). As a result of the implantation of the low concentration N-type ion, a high threshold NMOS transistor is formed in the right half of the wafer 10 as described in detail later. Finally, the process removes the resist (S16).

Figure 2A:
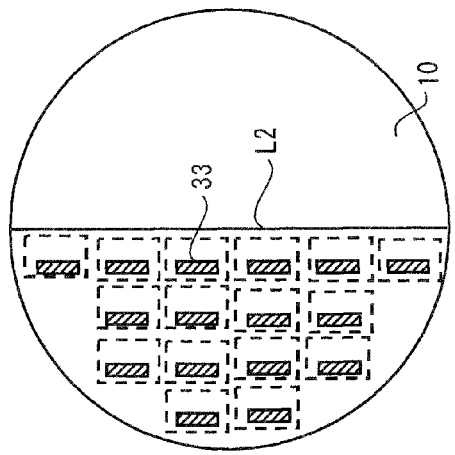
FIGS. 2A to 2E are views showing a sample wafer fabrication method according to a first embodiment of the present invention.
Figure 2B:
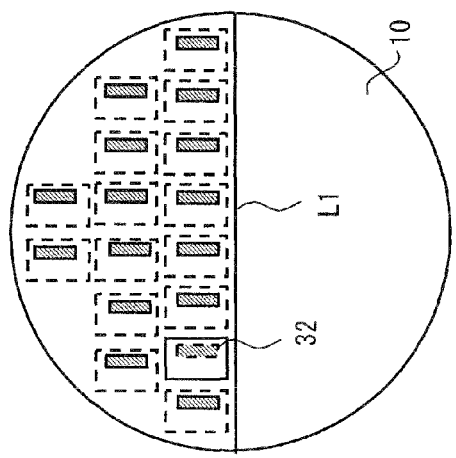
Figure 2C:
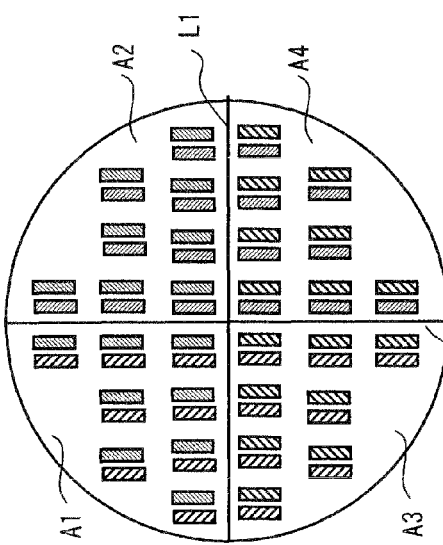
Figure 2D:
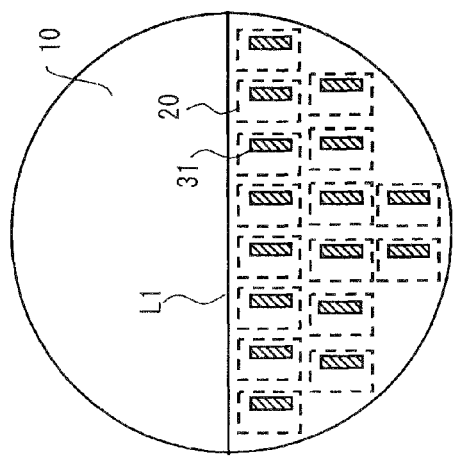
Figure 2E:
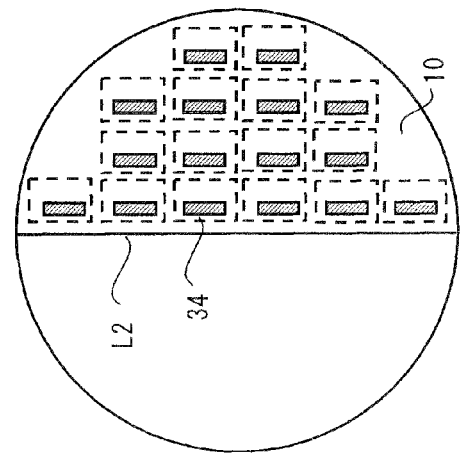
Figure 3:
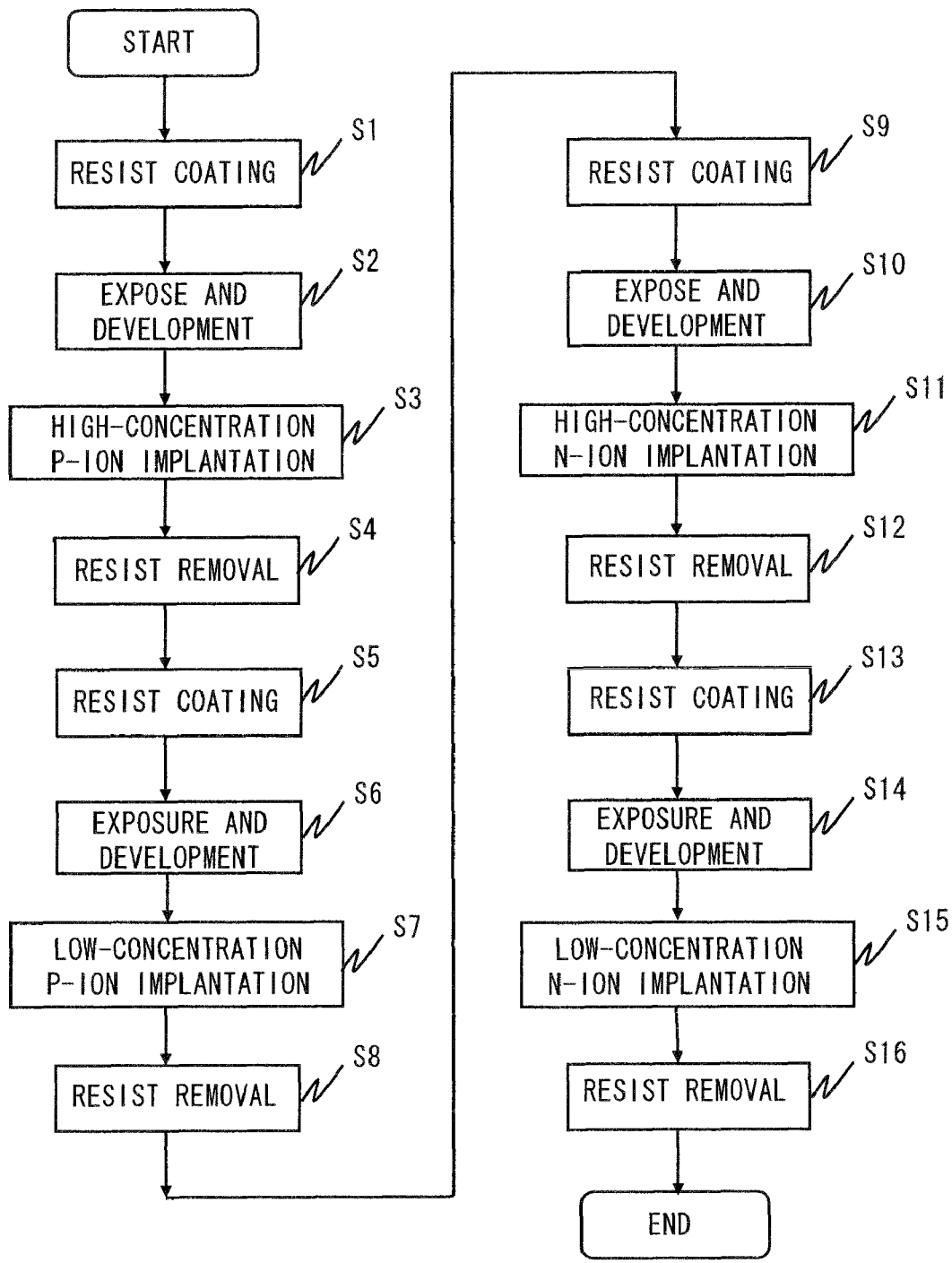
FIG. 3 is a flowchart showing the sample wafer fabrication method according to the first embodiment of the present invention.

As described above, the channel regions 31 to 34 in which an impurity doping amount is different from one another are respectively formed in four regions (which are respectively referred to hereinafter as a first region A1, a second region A2, a third region A3 and a fourth region A4) on the wafer 10 that are made by vertically and horizontally dividing one wafer 10 (FIG. 2E).

Specifically, in the first region A1 on the wafer 10, the low concentration P-type channel region 32 and the high concentration N-type channel region 33 are formed. Thus, the high threshold PMOS transistor and the low threshold NMOS transistor can be formed in the first region A1 on the wafer 10.

In the second region A2 on the wafer 10, the low concentration P-type channel region 32 and the low concentration N-type channel region 34 are formed. Thus, the high threshold PMOS transistor and the high threshold NMOS transistor can be formed in the second region A2 on the wafer 10.

In the third region A3 on the wafer 10, the high concentration P-type channel region 31 and the high concentration N-type channel region 33 are formed. Thus, the low threshold PMOS transistor and the low threshold NMOS transistor can be formed in the third region A3 on the wafer 10.

In the fourth region A4 on the wafer 10, the high concentration P-type channel region 31 and the low concentration N-type channel region 34 are formed. Thus, the low threshold PMOS transistor and the high threshold NMOS transistor can be formed in the fourth region A4 on the wafer 10.

After forming the channel regions with different impurity doping amount by the above-described process, P-channel and N-channel transistors are formed by a known semiconductor manufacturing process. As described above, the low threshold NMOS transistor and PMOS transistor and the high threshold NMOS transistor and PMOS transistor can be formed. After that, a test for measuring the ON-current of each transistor or the like is performed, and an impurity doping amount of the wafer is determined by the method illustrated in FIG. 1.

This embodiment enables the fabrication of a sample wafer which includes four regions (A1 to A4) in which channel regions with different impurity doping amount are formed on one wafer 10. It is thereby possible to form a level sample with the consideration of wafer in-plane tendency only. Further, because of the use of a single wafer, it is possible to eliminate the need for considering variations in gate length between wafers.

Furthermore, because the transistors having four different threshold characteristics can be formed with one wafer, it is possible to reduce the number of diffusion steps of the wafer. It is also possible to estimate the tendency of level characteristics in one wafer test. Although four kinds of regions having four different characteristics Tr1 to Tr4 are formed in this embodiment, it is not limited thereto. For example, when manufacturing a semiconductor device which includes P-channel transistor only or N-channel transistor only, a sample wafer which includes a plurality of kinds of channel regions of P-type or N-type with different impurity doping amount, rather than the above-described four regions, on one wafer may be fabricated.

Second Embodiment

FIG. 4 is a view showing an exposure method by exposure shots in a sample wafer fabrication method according to a second embodiment of the present invention. The process of fabricating a sample wafer is the same as that of the first embodiment and thus not described in detail hereinbelow. Although the first embodiment forms the first to fourth regions having the channel regions with different impurity doping amount on a wafer, this embodiment divides one wafer into stripe regions and forms a channel region so as to have different transistor characteristics in each of the divided regions.

Figure 4A:
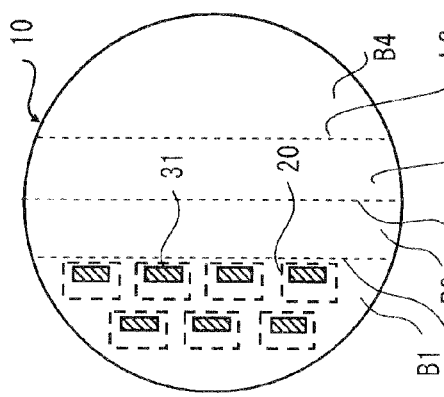
FIGS. 4A to 4H are views showing a sample wafer fabrication method according to a second embodiment of the present invention.
Figure 4B:
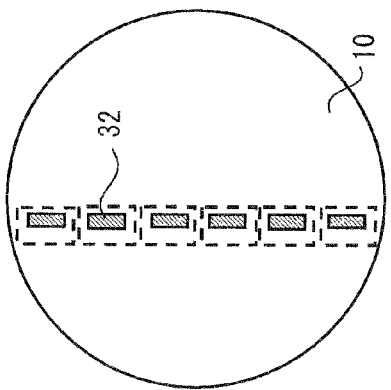
Figure 4C:
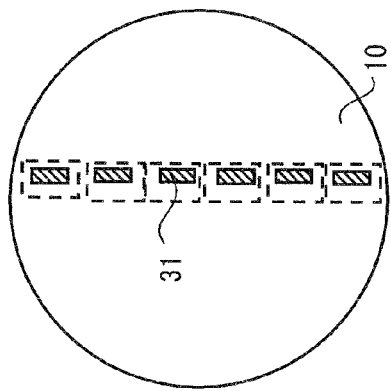

Specifically, the process first divides a wafer into a plurality of regions. In this embodiment, a wafer is divided into four regions B1 to B4 by three line segments L11, L12 and L13 which are in parallel with one another. Then, the process performs exposure in the first region B1 at a plurality of exposure shots indicated by the region 20 with the use of a P-type mask and develops the resist, thereby forming a resist pattern in the first region B1 (FIG. 4A). Using the resist pattern as a mask, a high concentration P-type impurity ion, for example, is implanted to form the high concentration P-type channel region 31. For example, boron may be used as the impurity, and the impurity concentration may be about $1.5 \times 10^{13}$ $(cm^{-2})$.

Then, the process performs exposure in the second region B2 at a plurality of exposure shots with the use of the P-type mask which is the same as the one used in the formation of the high concentration P-type channel region 31 and develops the resist, thereby forming a resist pattern in the second region B2 (FIG. 4B) Using the resist pattern as a mask, a low concentration P-type impurity ion, for example, is implanted to form the low concentration P-type channel region 32. For example, boron may be used as the impurity, and the impurity concentration may be about $8 \times 10^{12}$ $(cm^{-2})$.

Then, the process performs exposure in the third region B3 at a plurality of exposure shots indicated by the region 20 with the use of the same P-type mask and develops the resist, thereby forming a resist pattern in the third region B3 (FIG. 4C) Using the resist pattern as a mask, a high concentration P-type impurity ion, for example, is implanted to form the high concentration P-type channel region 31.

Figure 4D:
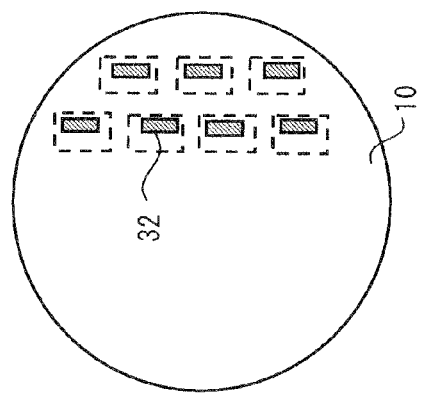

Further, the process performs exposure in the fourth region B4 at a plurality of exposure shots indicated by the region 20 with the use of the same P-type mask and develops the resist, thereby forming a resist pattern in the fourth region B4 (FIG. 4D). Using the resist pattern as a mask, a low concentration P-type impurity ion, for example, is implanted to form the low concentration P-type channel region 32.

Figure 4E:
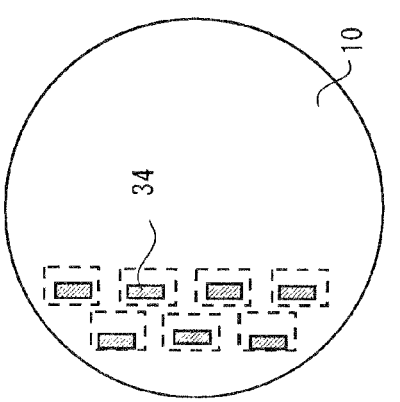
Figure 4F:
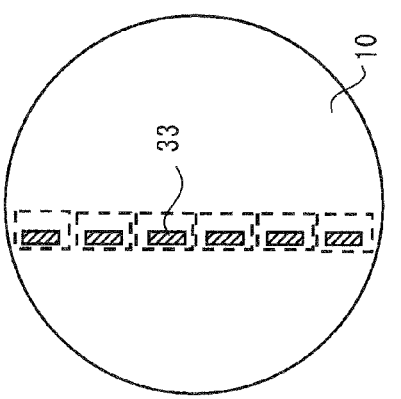
Figure 4G:
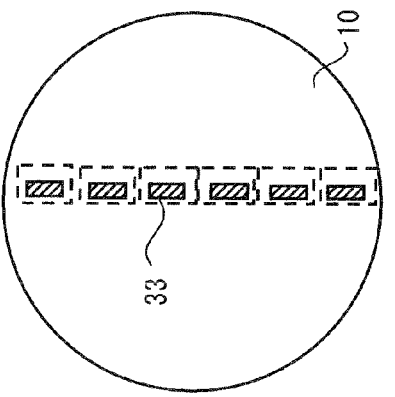

Next, the process performs exposure in the first region B1 at a plurality of exposure shots indicated by the region 20 with the use of an N-type mask and develops the resist, thereby forming a resist pattern in the first region B1 (FIG. 4E). Using the resist pattern as a mask, a low concentration N-type impurity ion, for example, is implanted to form the low concentration N-type channel region 34. For example, phosphorus may be used as the impurity, and the impurity concentration may be about $1.5 \times 10^{13}$ $(cm^{-2})$ Then, the process performs exposure in the second region B2 at a plurality of exposure shots indicated by the region 20 with the use of the N-type mask which is the same as the one used in the formation of the low concentration N-type channel region 34 and develops the resist, thereby forming a resist pattern in the second region B2 (FIG. 4F). Using the resist pattern as a mask, a high concentration N-type impurity ion, for example, is implanted to form the high concentration N-type channel region 33. For example, phosphorus may be used as the impurity, and the impurity concentration may be about $2.2 \times 10^{13}$ $(cm^{-2})$ Then, the process performs exposure in the third region B3 at a plurality of exposure shots indicated by the region 20 with the use of the same N-type mask and develops the resist, thereby forming a resist pattern in the third region B3 (FIG. 4G). Using the resist pattern as a mask, a high concentration N-type impurity ion, for example, is implanted to form the high concentration N-type channel region 33.

Figure 4H:
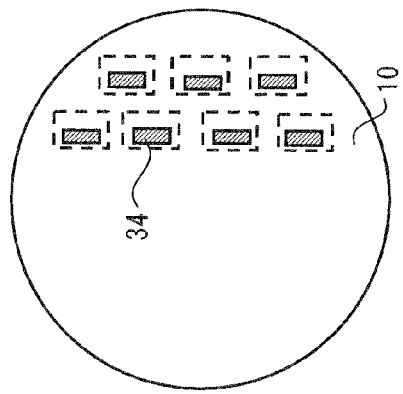

Finally, the process performs exposure in the fourth region B4 at a plurality of exposure shots indicated by the region 20 with the use of the same N-type mask and develops the resist, thereby forming a resist pattern in the fourth region B4 (FIG. 4H). Using the resist pattern as a mask, a low concentration N-type impurity ion, for example, is implanted to form the low concentration N-type channel region 34.

As described above, this embodiment divides one wafer into stripe regions and forms a channel region with a different impurity doping amount in each of the divided regions (the first region B1 to the four region B4). Specifically, in the first region B1 on the wafer 10, a high concentration P-type ion and a low concentration N-type ion are implanted. Thus, a low threshold PMOS transistor and a high threshold NMOS transistor can be formed in the first region B1 on the wafer 10 using a known semiconductor manufacturing process.

In the second region B2 on the wafer 10, a low concentration P-type ion and a high concentration N-type ion are implanted. Thus, a high threshold PMOS transistor and a low threshold NMOS transistor can be formed in the second region B2 on the wafer 10 using a known semiconductor manufacturing process.

In the third region B3 on the wafer 10, a high concentration P-type ion and a high concentration N-type ion are implanted. Thus, a low threshold PMOS transistor and a low threshold NMOS transistor can be formed in the third region B3 on the wafer 10 using a known semiconductor manufacturing process.

In the fourth region B4 on the wafer 10, a low concentration P-type ion and a low concentration N-type ion are implanted. Thus, a high threshold PMOS transistor and a high threshold NMOS transistor can be formed in the fourth region B4 on the wafer 10 using a known semiconductor manufacturing process. Further, a test for measuring the ON-current of each transistor is performed, and an impurity doping amount of the wafer is determined by the method illustrated in FIG. 1.

Like the first embodiment, this embodiment divides one wafer into a plurality of stripe regions and forms a channel region with a different impurity doping amount in each region. This enables the formation of a sample wafer which has different transistor characteristics on one wafer, and it is thereby possible to form a level sample with the consideration of wafer in-plane tendency only. The wafer may be divided into a larger number of regions. When it is divided into a larger number of regions, ion implantation may be performed at a plurality of kinds of ion concentrations, which enables the fabrication of a sample wafer having larger varieties of transistor characteristics.

Figure 5:
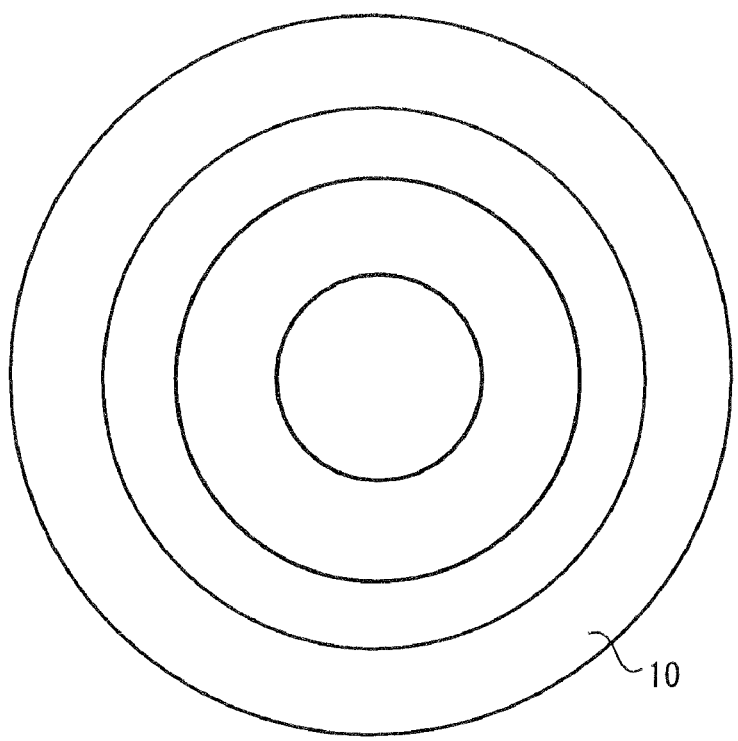
FIG. 5 is a view showing an example of a sample wafer according to an embodiment of the present invention.
Figure 6:
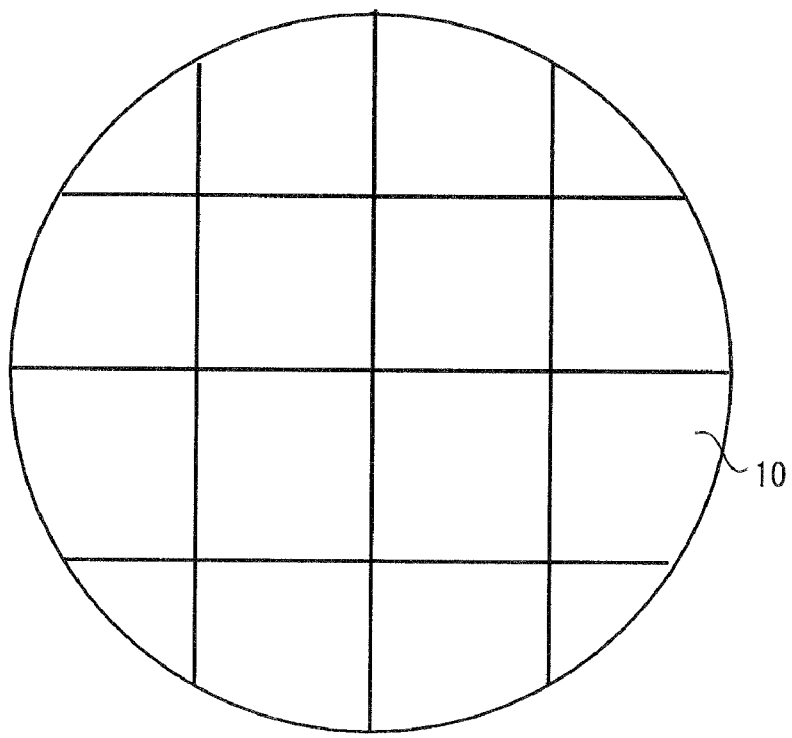
FIG. 6 is a view showing another example of a sample wafer according to an embodiment of the present invention.
Figure 7:
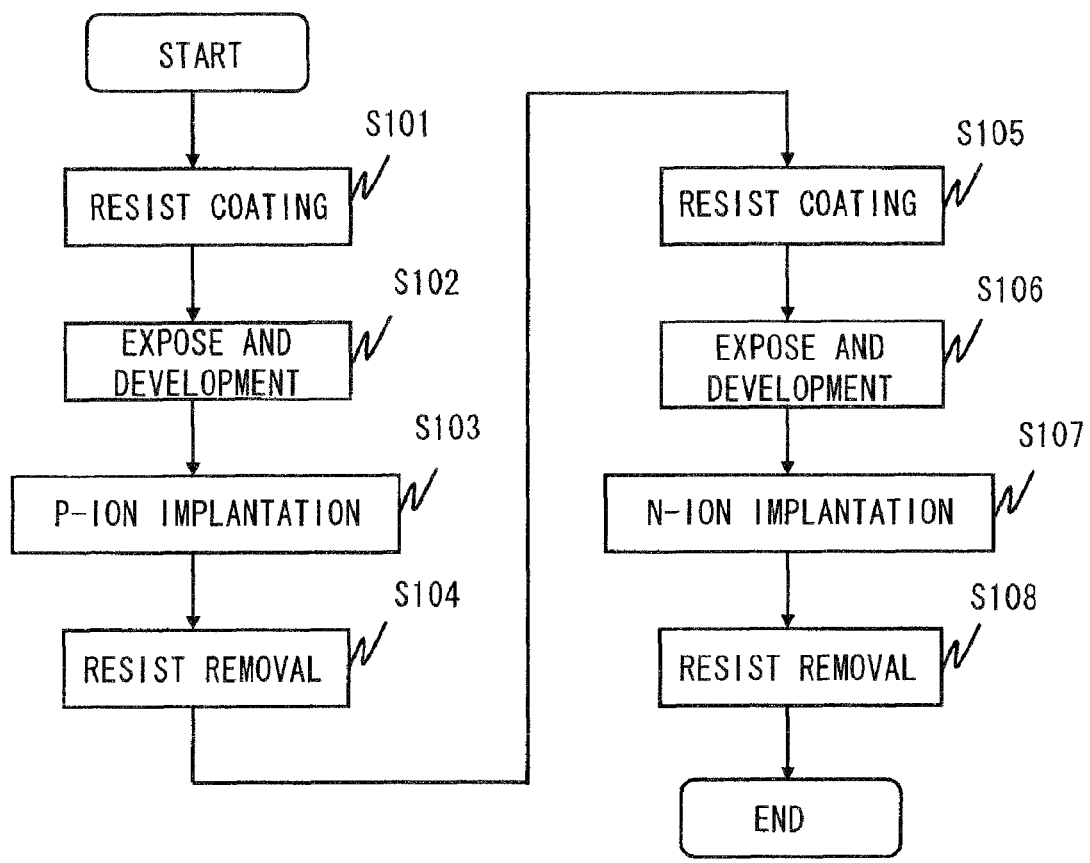
FIG. 7 is a flowchart showing a sample wafer fabrication method according to a related art.

The present invention is not limited to the above-described embodiments, and various changes and modifications may be made without departing from the scope of the invention. For example, the regions to form the channel regions with different impurity doping amount may have a concentric shape as shown in FIG. 5, a grid shape as shown in FIG. 6, or a horizontal stripe shape.

In this case, it is preferred that the region where the high concentration P-type channel region 31 and the low concentration N-type channel region 34 are formed, the region where the low concentration P-type channel region 32 and the high concentration N-type channel region 33 are formed, the region where the high concentration P-type channel region 31 and the high concentration N-type channel region 33 are formed, and the region where the low concentration P-type channel region 32 and the low concentration N-type channel region 34 are formed are arranged uniformly over the wafer. It is thereby possible to reduce in-plane variations on the wafer.

In the case where the level of a P-channel only or an N-channel only is required, the wafer may be divided into two parts and a high impurity concentration channel region and a low impurity concentration channel region may be formed. In this case also, it is preferred to divide the wafer into a plurality of regions and uniformly arrange the high impurity concentration channel region and the low impurity concentration channel region so as to reduce in-plane variations.

It is apparent that the present invention is not limited to the above embodiments, but may be modified and changed without departing from the scope and spirit of the invention.

What is claimed is:

1. A wafer fabrication method, comprising:
   a first step of forming a plurality of first channel regions with a first conductivity type in a first region on a surface of a wafer by making a plurality of exposure shots and performing development on a resist formed in the first region to form a resist pattern and implanting an impurity ion with the first conductivity type into the wafer using the resist pattern in the first region as a mask;
   a second step of forming a plurality of second channel regions with the first conductivity type having an impurity concentration different from an impurity concentration of the first channel regions in a second region different from the first region on the surface of the wafer by making a plurality of exposure shots and performing development on a resist formed in the second region to form a resist pattern and implanting an impurity ion with the first conductivity type into the wafer using the resist pattern in the second region as a mask;
   a third step of forming a plurality of third channel regions with a second conductivity type different from the first conductivity type in a third region on the surface of the wafer by making a plurality of exposure shots and performing development on a resist formed in the third region to form a resist pattern and implanting an impurity ion with the second conductivity type into the wafer using the resist pattern in the third region as a mask; and
   a fourth step of forming a plurality of fourth channel regions with the second conductivity type having an impurity concentration different from an impurity concentration of the third channel regions in a fourth region different from the third region on the surface of the wafer by making a plurality of exposure shots and performing development on a resist formed in the fourth region to form a resist pattern and implanting an impurity ion with the second conductivity type into the wafer using the resist pattern in the fourth region as a mask,
   wherein the first region and the second region are two regions divided by a first line segment on the wafer, and the third region and the fourth region are two regions divided by a second line segment intersecting with the first line segment on the wafer.

2. The wafer fabrication method according to claim 1, wherein the plurality of exposure shots in the first step and the second step are made using the same mask, and the plurality of exposure shots in the third step and the fourth step are made using the same mask.

* * * * *